(12) United States Patent
Ratzel

(10) Patent No.: US 6,937,683 B1
(45) Date of Patent: Aug. 30, 2005

(54) COMPACT DIGITAL TIMING RECOVERY CIRCUITS, DEVICES, SYSTEMS AND PROCESSES

(75) Inventor: David G. Ratzel, Decatur, GA (US)

(73) Assignee: Cirronet Inc., Norcross, GA (US)

( * ) Notice: Subject to any disclaimer, the term of this patent is extended or adjusted under 35 U.S.C. 154(b) by 882 days.

(21) Appl. No.: 09/816,499

(22) Filed: Mar. 23, 2001

Related U.S. Application Data

(60) Provisional application No. 60/191,986, filed on Mar. 24, 2000.

(51) Int. Cl.[7] ............................. H03D 3/24; H03L 7/06
(52) U.S. Cl. ...................... 375/376; 375/327; 327/159
(58) Field of Search .................. 375/376, 371, 375/373, 326, 327; 327/147, 150, 151, 156, 327/159, 160; 329/325

(56) References Cited

U.S. PATENT DOCUMENTS

| | | | |
|---|---|---|---|
| 4,019,153 A | * | 4/1977 | Cox et al. .................. 331/1 A |
| 4,808,884 A | * | 2/1989 | Hull et al. .................. 375/376 |
| 6,134,276 A | | 10/2000 | Aman et al. |
| 6,144,674 A | | 11/2000 | Peres et al. |
| 6,148,037 A | | 11/2000 | Abe |
| 6,151,178 A | | 11/2000 | Glover |
| 6,154,510 A | | 11/2000 | Cochran et al. |
| 6,154,871 A | | 11/2000 | Claydon et al. |
| 6,157,646 A | | 12/2000 | Nichols |
| 6,178,216 B1 | | 1/2001 | Lee |
| 6,181,175 B1 | | 1/2001 | Wolf |
| 6,181,660 B1 | | 1/2001 | Hirayama et al. |
| 6,181,758 B1 | | 1/2001 | Trimmel et al. |
| 6,185,150 B1 | | 2/2001 | Toda et al. |

* cited by examiner

Primary Examiner—Khai Tran
Assistant Examiner—David B. Lugo
(74) Attorney, Agent, or Firm—Wallenstein Wagner & Rockey, Ltd.

(57) ABSTRACT

A digitally implemented timing recovery circuit for recovering a clock signal from an input bit stream. The recovery circuit comprising an edge detector for detecting a transition from "0" to "1" or "1" to "0" in the input bit stream, a phase counter having a plurality of registers indicative of the phase counter transition state, and a loop counter having a plurality of registers indicative of the loop counter transition state. When the phase counter reaches a particular transition state, a recovered clock pulse is enabled. The phase counter is preferably non-linear to optimize the circuit.

12 Claims, 3 Drawing Sheets

LOGIC CIRCUIT IMPLEMENTATION OF SIMPLIFIED TIMING RECOVERY CIRCUIT.

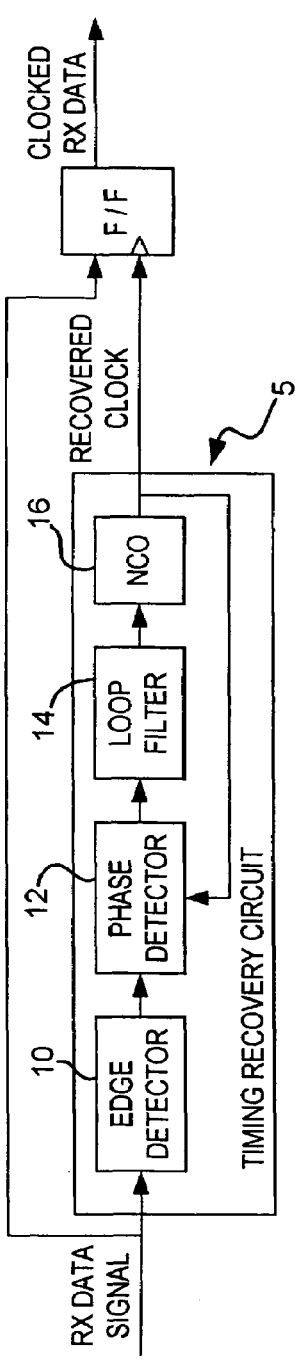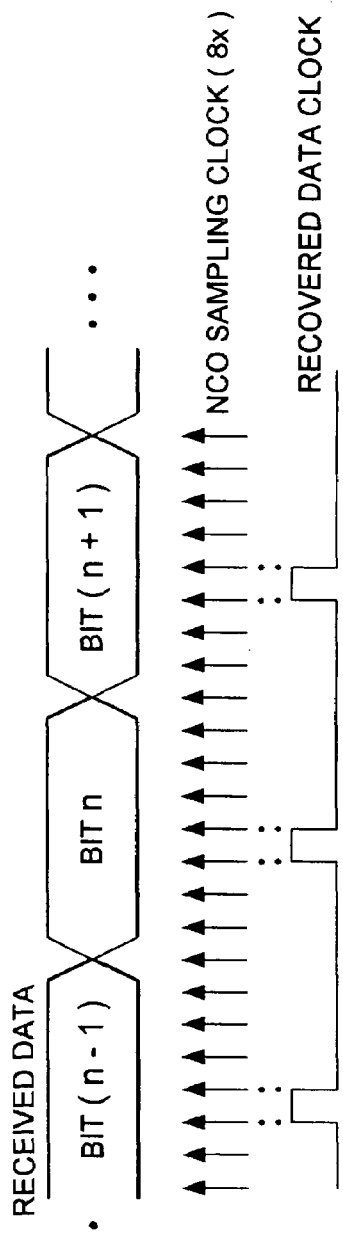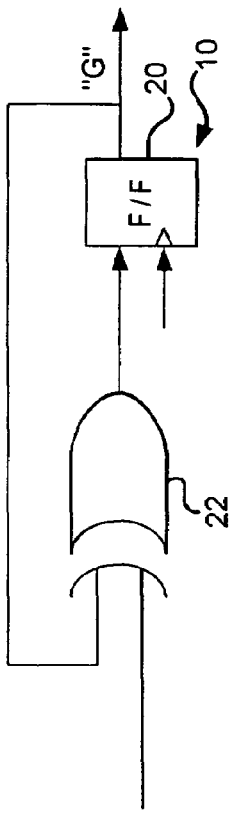

FIG. 4  NONLINEAR PHASE COUNTER.
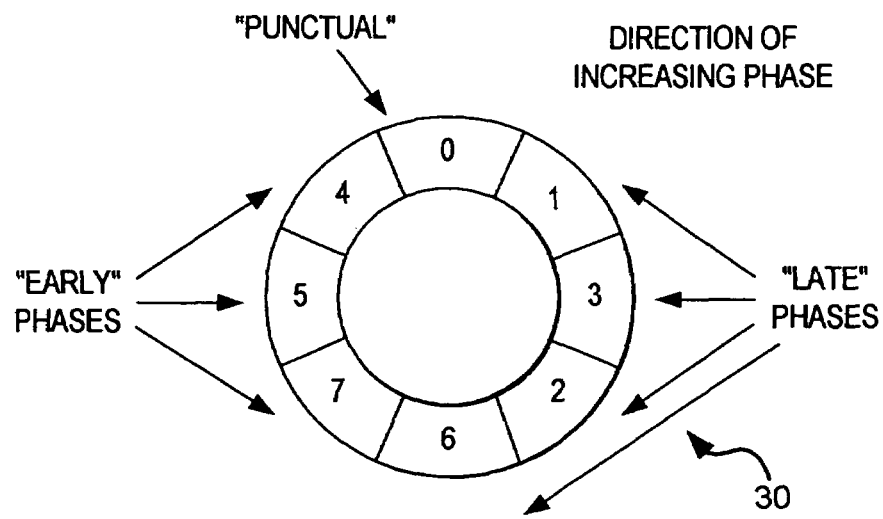
FIG. 5  STATE MACHINE "C", THE PHASE COUNTER.
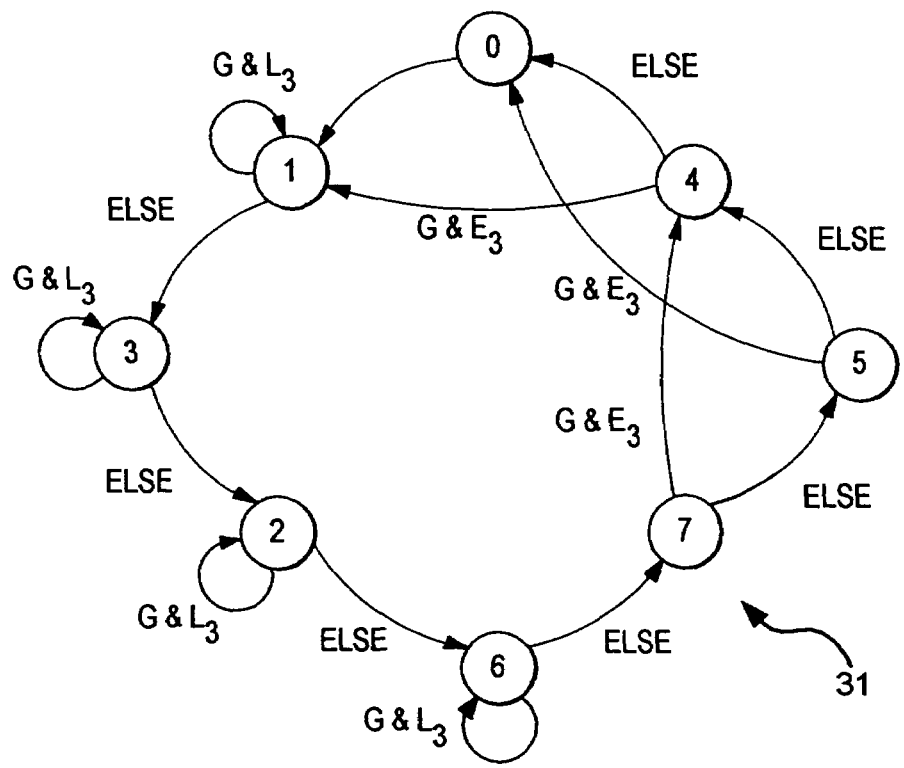

FIG. 6 STATE MACHINE "F", THE LOOP COUNTER.
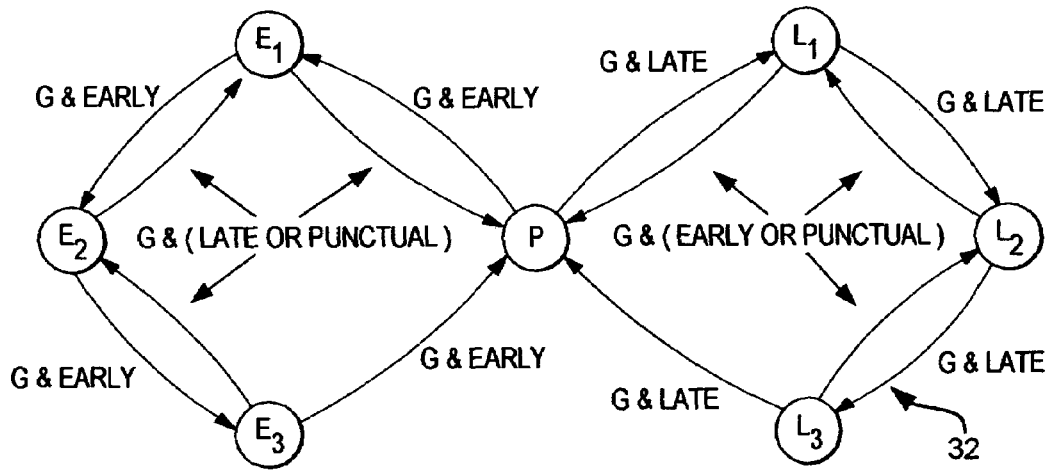
FIG. 7 LOGIC CIRCUIT IMPLEMENTATION OF SIMPLIFIED TIMING RECOVERY CIRCUIT.
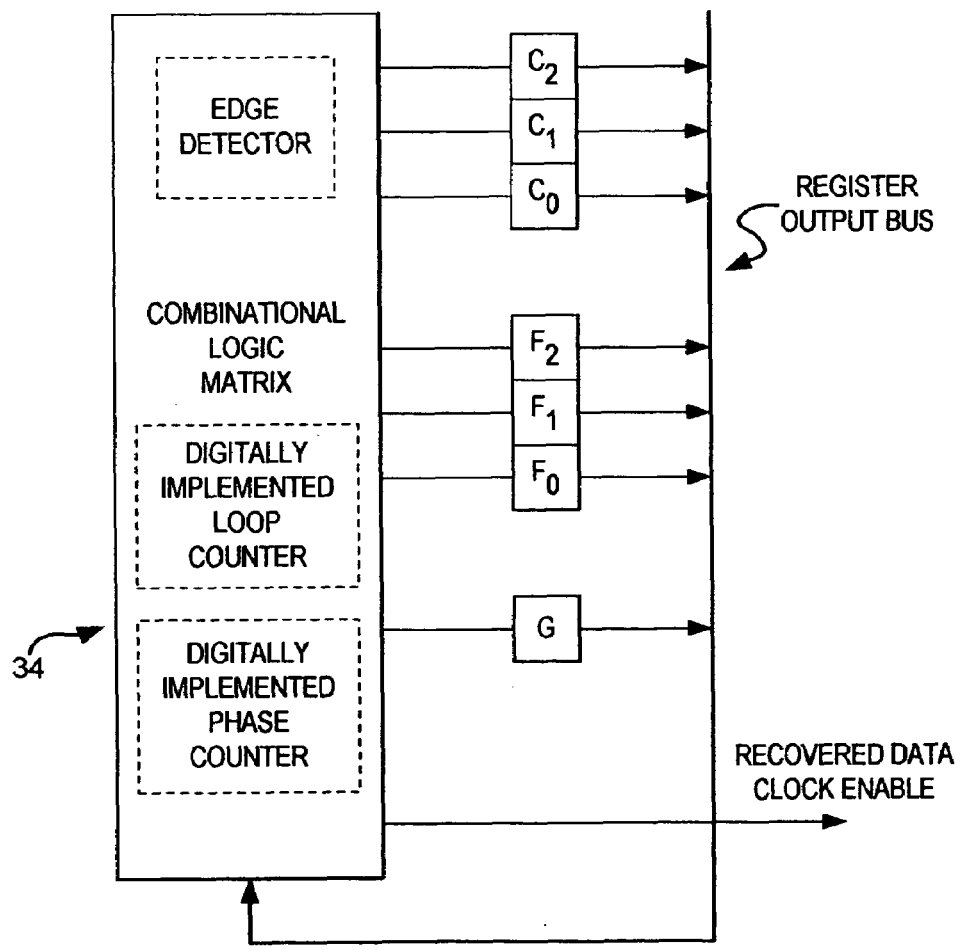

COMPACT DIGITAL TIMING RECOVERY CIRCUITS, DEVICES, SYSTEMS AND PROCESSES

RELATED APPLICATIONS

The present application claims priority from U.S. Provisional Patent Application No. 60/191,986, filed Mar. 24, 2000.

TECHNICAL FIELD

The present invention is generally directed to a digital timing recovery circuit, and more particularly, the invention is directed to a digital phase-locked tracking loop timing recovery circuit for use in a programmable logic device or integrated circuit.

BACKGROUND OF THE INVENTION

In digital communications networks, it is common practice to transmit a binary data stream without explicitly transmitting a corresponding clocking signal. In such instances, a clock signal must be recovered from the data stream itself. One method of achieving this is to detect edge transitions between data bits and input this information to a phase-locked tracking loop (PLL) which then generates the desired clock.

Such a timing recovery circuit consists of an edge detector, a phase detector and a numerically-controlled oscillator (NCO). The NCO runs at a sample rate that is an integer multiple of the clock rate of the data itself which determines the precision with which the recovered clock can be produced. The basic functioning of this circuit is well-known to those skilled in the art. However, prior to the present invention, such clock recovery circuits have not been fully digitally implemented.

SUMMARY OF THE INVENTION

The present invention is directed to compact and efficient circuits and processes for recovering the timing of bits from a received binary waveform in digital communications systems. Circuits and processes according to the present invention include a standard phase-locked loop incorporating an edge detector, phase detector, loop filter and numerically controlled oscillator to perform their functions all with minimal requirement for logic circuits in the form of flip flops and combinatorial logic. Compactness makes such circuits especially suitable for implementation as a submodule in an integrated circuit or programmable logic array.

In one embodiment, the present invention is a simplified implementation of a digital PLL timing recovery circuit optimized for use in a programmable logic device or custom integrated circuit. The design comprises a full NCO-based timing recovery circuit while fitting into just 7 registers. The sampling rate of the NCO is 8 times the data bit rate of the received data.

In a further embodiment a digital phase-locked tracking loop timing recovery circuit is disclosed. The circuit includes an edge detector for detecting an edge transition in an input bit stream. This occurs when the bits in the stream change from "0" to "1," or "1" to "0." No edge transition is detected as long as the bit stream is repeating the same bit. The circuit also includes a digitally implemented loop counter including a plurality of registers indicative of a transition state of the loop counter; and, a digitally implemented phase counter including a plurality of registers indicative of a transition state of the phase counter. The transition states of the loop counter and phase counter effect enablement of clock pulse recovered from the bit stream.

The phase counter is designed to preferably advance to a subsequent state at an integer multiple of the clock rate of the incoming bit stream. The counting states of the phase counter can be arranged in a non-linear manner to minimize the amount of coding required to implement advancing of transition states. Additionally, the transition state of the phase counter is also responsive to detection of the edge transition in the input bit stream, the transition state of the loop counter, and a prior transition state of the phase counter. That is, when an edge detection occurs, the next transition state of the phase counter is controlled by the transition state of the loop counter and the prior state of the phase counter (i.e., where the phase counter is at the time of the detection). The transition state of the loop counter is responsive to the detection of the edge transition in the input bit stream, a prior transition state of the loop counter and a transition state of the phase counter at the time of detection of the edge transition.

The counting states of the phase counter of the circuit include a first set of states indicative of an early phase, and a second set of states indicative of a late phase of a detected edge of the input bits. These states effect the transition states of both the phase counter and the loop counter of the circuit.

The loop counter and the phase counter are implemented to follow certain rules regarding changing the respective transition states of these components. In this regard, the loop counter can be in one of a plurality of progressively advancing early phase transition states, a plurality of progressively advancing late phase transition states and a neutral state.

Preferably, one rule governing the transition state of the loop counter is that the transition state of the loop counter advances toward a maximum early phase transition state when an edge transition detection occurs during an early phase transition state of said phase counter. Additionally, when already in the maximum early phase transition state, the transition state of the loop counter advances toward the neutral state when an edge transition detection occurs during an early phase transition state of the phase counter.

According to another rule, the transition state of the loop counter advances toward a maximum late phase transition state when an edge transition detection occurs during a late phase transition state of the phase counter. Also, the transition state of the loop counter advances toward the neutral state from a maximum late phase transition state of the loop counter when an edge transition detection occurs during a late phase transition state of the phase counter. According to another rule the transition state of the loop counter advances toward the neutral state when an edge transition detection occurs during a punctual transition state of the phase counter.

According to other rules, the transition state of the phase counter advances a set number of transition states when an edge transition detection occurs during an early phase transition state of the phase counter and the loop counter is at a maximum early phase transition state. This set number of transition states is preferably two transitions states. Also, the transition state of the phase counter retards a set number of transition states when an edge transition detection occurs during a late phase transition state of the phase counter and the loop counter is at a maximum late phase transition state. This set number of transition states is preferably one transition state.

The recovery circuit can be part of a programmable logic chip or an integrated circuit.

In a further embodiment, an integrated circuit for recovering a clock pulse from a stream of input bits comprises a digitally implemented phase counter for indicating a phase state of a detected edge of an input bit and enabling a clock output. The circuit also includes a digitally implemented loop counter responsive to the phase state of the phase counter. The phase counter has a transition state that is responsive to a transition state of the loop counter. The phase states for the phase counter are non-linear.

The phase counter includes a plurality of registers for indicating the transition state of the phase counter. Similarly, the loop counter includes a plurality of registers for indicating the transition state of the loop counter. Additionally, the circuit includes a register for indicating detection of an edge of an input bit.

Further aspects of the invention are disclosed in the detailed description of the preferred embodiment, the drawings and the claims.

BRIEF DESCRIPTION OF THE DRAWINGS

FIG. 1 is a schematic diagram of a portion of a prior art digital communications receiver, including the timing recovery circuit and data sampling flip-flop;

FIG. 2 discloses timing recovery waveforms from a conventional sampling of a received data stream and the clock recovered from it in accordance with the prior art;

FIG. 3 is a schematic diagram depicting an edge detector portion of the simplified timing recovery circuit of FIG. 1 and generation of a "G" signal in accordance with the prior art;

FIG. 4 is a functional diagram depicting a preferred embodiment of a nonlinear phase counter used by the present invention within the NCO;

FIG. 5 is a state transition diagram for the "C" counter of timing recovery circuits according to a preferred embodiment of the present invention;

FIG. 6 is a state transition diagram for the "F" counter of timing recovery circuits according to a preferred embodiment of the present invention; and, FIG. 7 discloses a register logic implementation of a timing recovery circuit in accordance with the present invention as might be found in a PLD.

DETAILED DESCRIPTION OF THE PREFERRED EMBODIMENT

While this invention is susceptible of embodiments in many different forms, there is shown in the drawings and will herein be described in detail preferred embodiments of the invention with the understanding that the present disclosure is to be considered as an exemplification of the principles of the invention and is not intended to limit the broad aspect of the invention to the embodiments illustrated.

The present invention includes various implementations of oversampling phase-locked loop based timing recovery circuits. One benefit of the present invention is that such circuits can be very compact, thereby using minimal resources within a digital logic chip or group of chips.

The organization of a timing recovery circuit 5 may be roughly broken down into several components. These include an edge detector 10, a phase counter and a loop filter 14. In the present invention, the phase detector 12 and NCO 16 functions that would be part of a normal PLL circuit are folded together into the phase counter portion of the circuit.

The edge detector 10, shown in FIG. 3, consists simply of flip-flop 20 and an XOR gate 22 and outputs a "1" whenever a transition occurs in the input bit stream. The output of the edge detector register is designated "G".

The waveforms for a timing recovery circuit are illustrated in FIG. 2. As shown, the NCO sampling clock 24 is eight times the rate of the bits of received data 26. The recovered clock 28 is at the same rate as the recovered data to provide a clocked data signal.

In the present invention, the phase counter portion of the circuit utilizes a nonlinear counter wherein the counting states ("0", "1", "3", "2", "6", "7", "5", "4") may be chosen in such a way (e.g., by computer search) as to minimize the amount of combinatorial decoding logic required to compute its states. One such non-linear phase counter 30 is graphically illustrated in FIG. 4. In contrast, an ordinary linear counter would typically require an additional one or two more output terms of a PLD, for instance.

Edge events in the input bitstream are expected to occur on phase "0" of the counter 30. Edge events occurring during phases "1", "3," "2" and "6" are considered to be "late" edges, while edges occurring during phases "4", "5" and "7" are considered to be "early." Additionally, state "6" is decoded to provide the data sampling clock enable which is the final output of the clock recovery circuit.

The NCO counter consists of three registers $C_2$, $C_1$ and $C_0$ (as shown in FIG. 7), referred to collectively as "C". As graphically illustrated in FIG. 5, the state transition diagram 31 for C is derived from the following set of rules:

1) If an edge occurs during the "early" phase of the clock counter and the F register is in state $E_3$, then advance the clock an extra cycle.
2) If an edge occurs during the "late" phase of the clock counter and the F register is in state $L_3$, then retard the clock by one cycle.

otherwise,

3) If none of the above apply, advance the clock one cycle.

According to the arrangement shown in FIG. 4, the three digit binary number (i.e., registers $C_2$, $C_1$ and $C_0$) for each succeeding state (i.e., "0" [000], to "1" [001], to "3" [011], to "2" [010] to "6" [110] to "7" [111] to "5" [101] to "4" [100] to "0" [000]) only differs by one digit, thus optimizing the implementation for changing from state to state in the absence of an edge detection.

The loop filter in this circuit also consists of three registers, $F_2$, $F_1$ and $F_0$ (as shown in FIG. 7), referred to collectively as "F". The state diagram 32 for F (FIG. 6) is derived from the following rules:

1) If an edge occurs during the "early" phase of the clock counter then advance F one step towards $E_3$. If F is already at $E_3$, then reset F to the neutral state P.
2) If an edge occurs during the "late" phase of the clock counter then advance F one step towards $L_3$. If F is already at $L_3$, then reset F to the neutral state P.
3) If an edge occurs during the "punctual" phase of the clock counter then move F one step towards P. If F is already at P, then do nothing.

otherwise,

4) If none of the above apply, leave F where it is.

As shown in FIG. 6, the loop filter can advance through three advancing early phase transitions $E_1$, $E_2$ and $E_3$, or three late phase transition states $L_1$, $L_2$ and $L_3$, or a punctual transition state P.

The complete design can be made to fit into as few as seven registers of a programmable logic chip or ASIC 34, such as that shown in FIG. 7.

While specific embodiments have been illustrated and described, numerous modifications are possible without departing from the spirit of the invention, and the scope of protection is only limited by the scope of the accompanying claims.

What is claimed is:

1. A digital phase-locked tracking loop timing recovery circuit comprising:

an edge detector for detecting an edge transition in an input bit stream;

a digitally implemented loop counter including a plurality of registers indicative of a transition state of said loop counter, wherein said loop counter can be in one of a plurality of progressively advancing early phase transition states, a plurality of progressively advancing late phase transition states and a neutral state; and, a digitally implemented phase counter including a plurality of registers indicative of a transition state of said phase counter, said transition state of said phase counter responsive to detection of said edge transition in said input bit stream, said transition state of said loop counter, and a prior transition state of said phase counter; said transition state of said loop counter responsive to said detection of said edge transition in said input bit stream, a prior transition state of said loop counter and a transition state of said phase counter at said detection of said edge transition, wherein said circuit generates clock pulses recovered from a stream of input bits, and wherein said transition states of said phase counter are non-linear and include a first set of states indicative of an early phase, and a second set of states indicative of a late phase.

2. The recovery circuit of claim 1 wherein said transition state of said loop counter advances toward a maximum early phase transition state when an edge transition detection occurs during an early phase transition state of said phase counter.

3. The recovery circuit of claim 1 wherein said transition state of said loop counter advances toward said neutral state from a maximum phase transition state of said loop counter when an edge transition detection occurs during an early phase transition state of said phase counter.

4. The recovery circuit of claim 1 wherein said transition state of said loop counter advances toward a maximum late phase transition state when an edge transition detection occurs during a late phase transition state of said phase counter.

5. The recovery circuit of claim 1 wherein said transition state of said loop counter advances toward said neutral state from a maximum late phase transition state of said loop counter when an edge transition detection occurs during a late phase transition state of said phase counter.

6. The recovery circuit of claim 1 wherein said transition state of said loop counter advances toward said neutral state when an edge transition detection occurs during a punctual transition state of said phase counter.

7. The recovery circuit of claim 1 wherein said transition state of said phase counter advances a set number of transition states when an edge transition detection occurs during an early phase transition state of said phase counter and said loop counter is at a maximum early phase transition state.

8. The recovery circuit of claim 7 wherein said set number of transition states is two transition states.

9. The recovery circuit of claim 1 wherein said transition state of said phase counter retards a set number of transition states when an edge transition detection occurs during a late phase transition state of said phase counter and said loop counter is at a maximum late phase transition state.

10. The recovery circuit of claim 9 wherein said set number of transition states is one transition state.

11. The recovery circuit of claim 1 wherein said circuit is part of a programmable logic chip.

12. The recovery circuit of claim 1 wherein said circuit is part of an integrated circuit.

* * * * *